United States Patent [19]
Lee

[11] Patent Number: 6,146,955
[45] Date of Patent: Nov. 14, 2000

[54] METHOD FOR FORMING DYNAMIC RANDOM ACCESS MEMORY DEVICE WITH AN ULTRA-SHORT CHANNEL AND AN ULTRA-SHALLOW JUNCTION

[75] Inventor: Robin Lee, Hsinchu Hsien, Taiwan

[73] Assignees: United Microelectronics Corp.; United Semiconductor Corp., both of Hsinchu, Taiwan

[21] Appl. No.: 09/439,791

[22] Filed: Nov. 12, 1999

[51] Int. Cl.$^7$ ................................................. H01L 21/336
[52] U.S. Cl. .................... 438/305; 438/301; 438/303; 438/291
[58] Field of Search .................... 438/291, 301, 438/303, 305

[56] References Cited

U.S. PATENT DOCUMENTS

| | | | |
|---|---|---|---|
| 5,750,430 | 5/1998 | Son | 438/303 |
| 5,874,341 | 2/1999 | Gardner et al. | 438/301 |
| 5,899,719 | 5/1999 | Hong | 438/239 |
| 6,015,746 | 1/2000 | Yeh et al. | 438/421 |
| 6,025,232 | 2/2000 | Wu et al. | 438/270 |

*Primary Examiner*—John F. Niebling
*Assistant Examiner*—Jennifer M. Kennedy
*Attorney, Agent, or Firm*—Charles C. H. Wu; Charles C. H. Wu & Associates, APC

[57] ABSTRACT

A Method for forming a dynamic random access memory device with an ultra-short channel and an ultra-shallow junction is described in the invention. In the invention, the spacer is used as a mask to define the channel length of the device, so that the channel length of the device is not limited by the resolution of the photolithography process, and the performance of the device is improved thereby. Furthermore, an inversion layer serves as a junction to reduce the electric field; thus, the reliability of the device is increased.

15 Claims, 4 Drawing Sheets

METHOD FOR FORMING DYNAMIC RANDOM ACCESS MEMORY DEVICE WITH AN ULTRA-SHORT CHANNEL AND AN ULTRA-SHALLOW JUNCTION

BACKGROUND OF THE INVENTION

1. Field of Invention

The present invention relates to a method for forming a semiconductor device. More particularly, the present invention relates to a method for forming a dynamic random access memory (DRAM) device with an ultra-short channel and an ultra-shallow junction.

2. Description of Related Art

As the dimensions of a semiconductor device are gradually reduced, the control of the critical dimension in a photolithography process, however, is hindered by the limitations of the light resolution and the depth of focus (DOF). This hindrance seriously affects the pursuit of a reduced memory cell area. Even when using an improved technique, such as phase shift mask (PSM), the photoresist is still unable to provide a reproducible definition.

The conventional approach to reduce the critical dimension usually requires employment of a more complicated mask, for example, PSM, and to conduct a special exposure technique, for example, an off-axial illumination. The purpose of reducing the critical dimension is achieved with the above approach; the manufacturing cost of an integrated circuit, however, is also increased significantly.

Although photolithography is one of the major techniques leading the development of semiconductor devices, it is also a major contributor to the manufacturing cost of the semiconductor. It is therefore desirable to employ less technically demanding photolithography techniques to form a small channel length and a device with a smaller dimension. Both the cost of production and the technical demands can be lowered while the operating speed of the device is improved.

Furthermore, due to the increase of the integration of a DRAM device, the dimensions of the memory cell and the area occupied by the DRAM capacitor are being reduced. Lowering the device dimension, however, lowers the capacitance. For a highly integrated DRAM device, a three dimensional capacitor is needed to maintain its capacitance at an acceptable value. As a result, a stacked capacitor, a trench-stacked capacitor or a crown-shaped capacitor is used to provide a large capacitor area and to lower the interference between the DRAM memory cells. As the complexity of the capacitor structure continues to increase, the height of the capacitor also increases. A capacitance-over-bit (COB) line is therefore normally used for the design of a storage node to avoid the limitation of space in the design of a capacitor.

SUMMARY OF THE INVENTION

The invention provides a method for forming a dynamic random access memory device with an ultra-short channel and an ultra-shallow junction by using a spacer as a mask; thus, the dimension of the device is not limited by the photolithography process.

As embodied and broadly described herein, the invention provides a method for forming a dynamic random access memory device with an ultra-short channel and an ultra-shallow junction. The method includes the following steps. A first oxide layer is formed on a substrate. A first opening exposing the substrate is formed in the first oxide layer. A pad oxide layer is formed in the first opening, and a silicon nitride spacer is formed on a sidewall of the first opening. A portion of the pad oxide layer is removed to form a second opening by using the silicon nitride spacer as a mask. A gate oxide layer is formed in the second opening. Then, a first conductive layer is formed within the second opening, and the surface of the first conductive layer is as high as that of the first oxide layer. A silicide layer is formed on the first conductive layer. A portion of the first oxide layer is removed to form a third opening, and a second oxide layer is formed in the third opening. Next, a polysilicon spacer is formed on a sidewall of the third opening. A first ion implantation process is performed to form a first doped region in the substrate under the third opening. A portion of the second oxide layer is removed by using the polysilicon spacer as a mask. A second conductive layer whose surface is as high as the first oxide layer is formed within the third opening; the second conductive layer couples with the first doped region. The residual first oxide layer and the silicon nitride spacer are removed in sequence. A second ion implantation process is performed to from a second doped region and a third doped region. Then, a planarized first dielectric layer is formed over the substrate. A contact opening exposing the second conductive layer is formed in the first dielectric layer, and then a bitline is formed within the contact opening. A planarized second dielectric layer is formed over the substrate; a storage node opening is formed in the second dielectric layer and the first dielectric layer. A storage node couples with the third doped region is then formed within the storage node opening.

In the invention, the spacer is used as a mask to define the channel length of the device, so that the channel length of the device is not limited by the resolution of the photolithography process, and the performance of the device is improved thereby. Furthermore, an inversion layer serves as a junction to reduce the electric field; thus, the reliability of the device is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
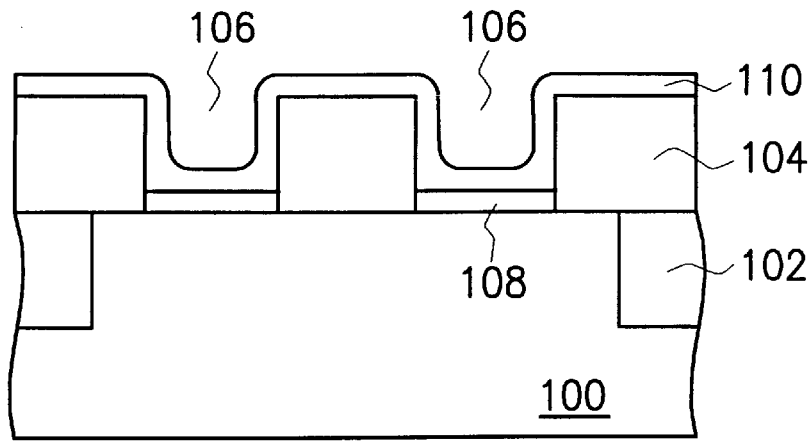
FIGS. 1A through 1J are schematic, cross-sectional views of a method for forming a DRAM device according to one preferred embodiment of this invention.

FIGS. 1A through 1J are schematic, cross-sectional views of a method for forming a DRAM device according to one preferred embodiment of this invention. Referring to FIG. 1A, a substrate 100 such as a p-type substrate is provided. An isolation structure 102, for example, local oxidation of silicon (LOCOS) or shallow trench isolation (STI), is formed in the substrate 100 to define an active region. An oxide layer 104 is formed on the substrate 100, and an opening 106 is formed in the oxide layer 104 to expose the substrate 100. A pad oxide layer 108 is formed in the opening 106, and a conformal silicon nitride layer 100 is then formed.

Figure 1B:
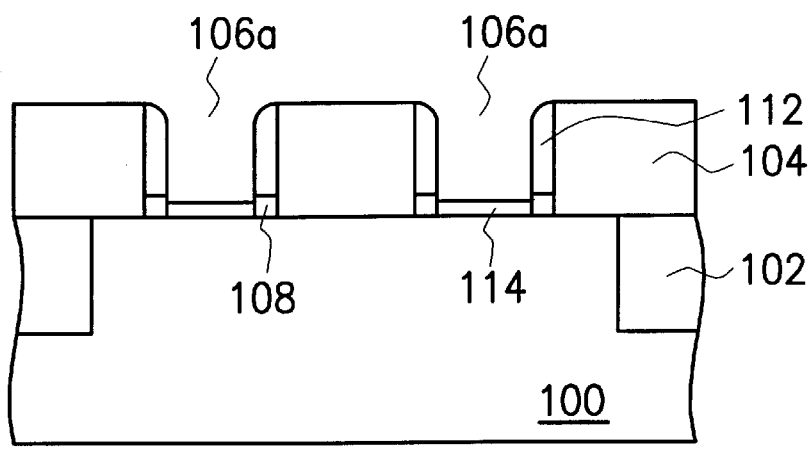

Refering to FIG. 1B, an etchback process is performed to remove a portion of the silicon nitride layer 110; then a spacer 112 is formed on a sidewall of the opening 106. A portion of the pad oxide layer 108 is removed to form an opening 106a. Next, a gate oxide layer 114 is formed in the opening 106a by, for example, thermal oxidation; a thickness of the gate oxide layer 114 is related the following processes.

Figure 1C:
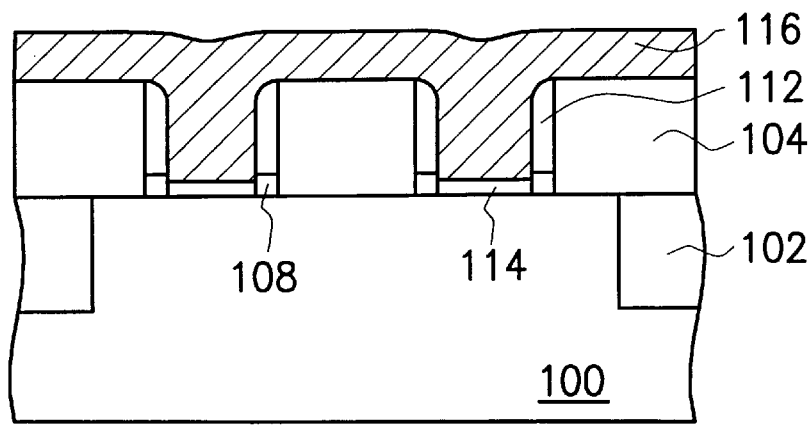

A conductive layer 116 made of a material such as polysilicon is formed over the substrate 100 and fills the openings 106a as shown FIG. 1C.

Figure 1D:
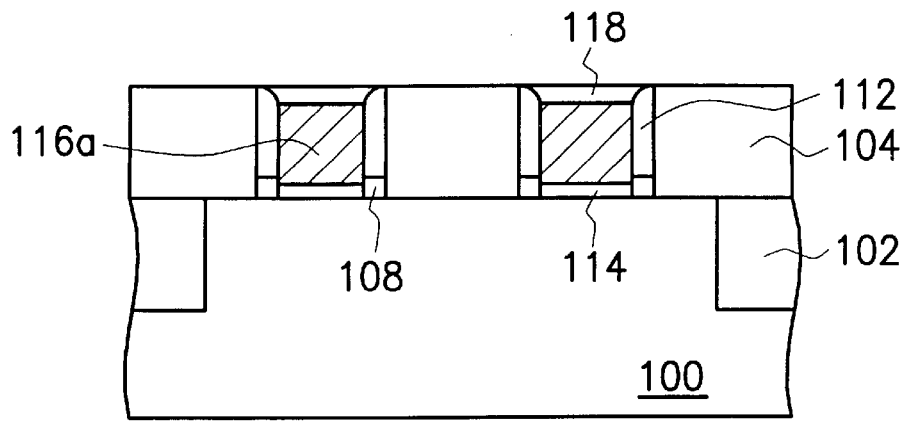

Referring to FIG. 1D, a portion of the conductive layer 116 is removed by etchback or chemical-mechanical polishing (CMP) to form a conductive layer 116a. A surface of the conductive layer 116a is about equally high with that of the oxide layer 104, and the conductive layer 116 serves as a wordline. Next, a silicide layer 118 is formed on the conductive layer 116a. The process of forming the silicide layer 118 is well known to those skilled in the art, so detailed descriptions are omitted herein.

Figure 1E:
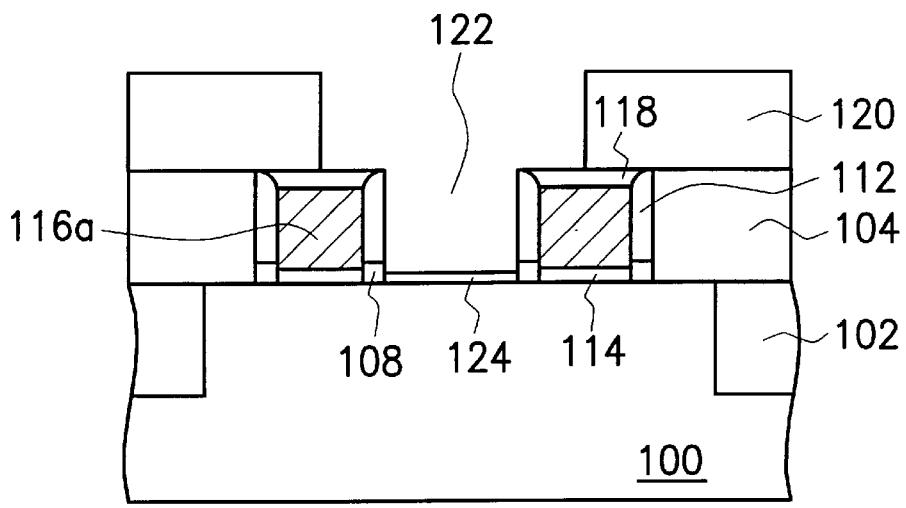

A patterned photoresist layer 120 is formed on the oxide layer 104. By using the photoresist layer 120 as a mask, a portion of the oxide layer 104 is removed to form a contact opening 122 exposing the substrate 100. An oxide layer 124 is formed on the substrate 100 exposed by the contact opening 122 as shown in FIG. 1E. The method of forming the oxide layer 124 is thermal oxidation, for example, and the oxide layer 124 is thinner than the gate oxide layer 114. Then, the photoresist layer 120 is stripped.

Figure 1F:
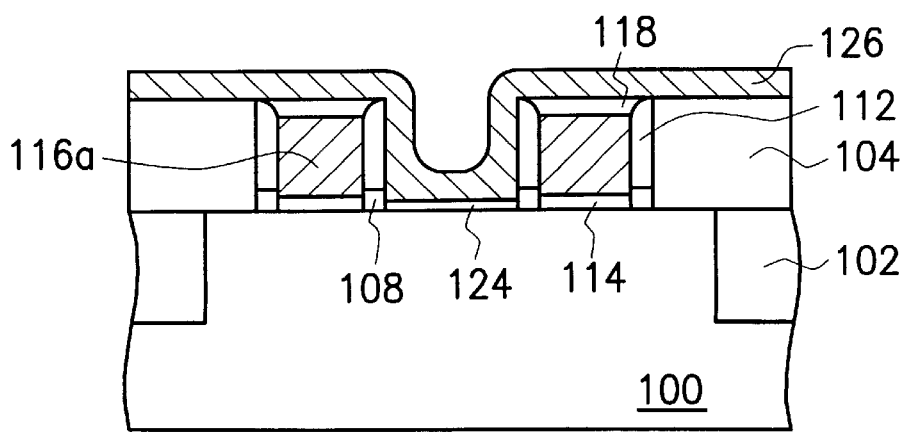

Referring to FIG. 1F, a conformal polysilicon layer 126 is formed on the oxide layer 124.

Figure 1G:
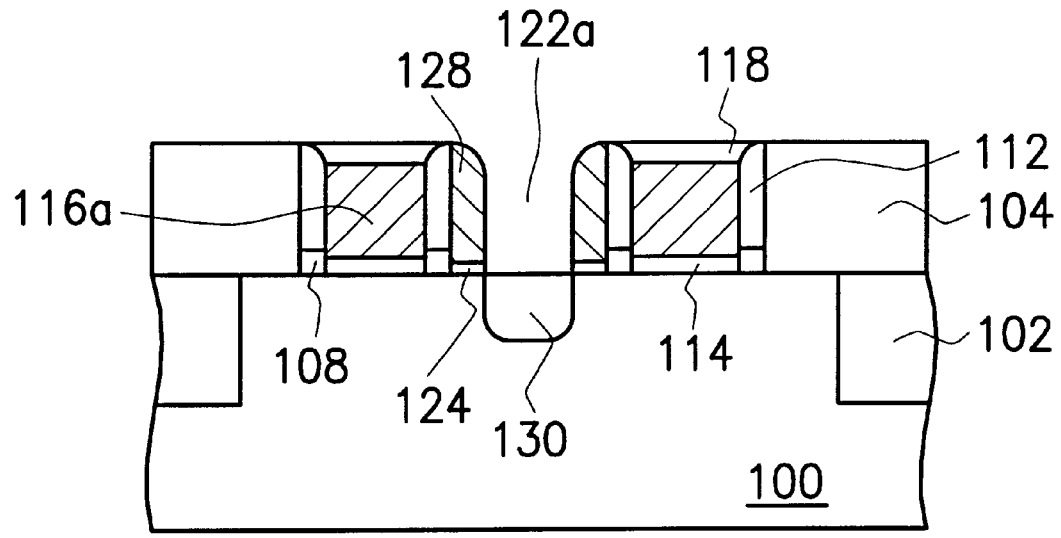
Figure 1H:
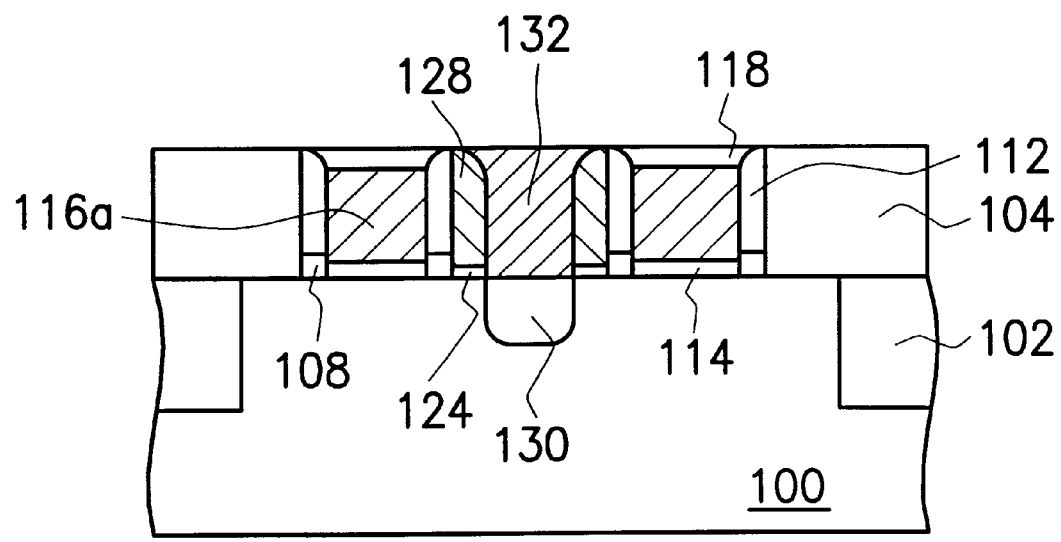

Referring to FIG. 1G, a portion of the polysilicon layer 126 is removed by etchback, a polysilicon spacer 128 is formed on a sidewall of the contact opening 122, and a contact opening 122a is formed. An ion implantation process is performed to Form a doped region 130 serving as a source region in the substrate 100 while using the contact opening 122a as a mask. Ions used in the ion implantation process are preferably n-type ions, and the dosage is about 1E15–1E16 ions/cm$^3$. Next, a portion of the oxide layer 124 is removed to expose the substrate 100 while using the polysilicon spacer 128 as a mask.

A conductive layer (not shown) made of, for example, polysilicon is formed over the substrate 100 and fills the contact opening 122a; then, a portion of the conductive layer is removed to form a conductive layer 132 whose surface is about equal to that of the oxide layer 104 by etchback or chemical-mechanical polishing. The conductive layer 132 couples with the doped region 130 for serving as a bitline contact.

Figure 1I:
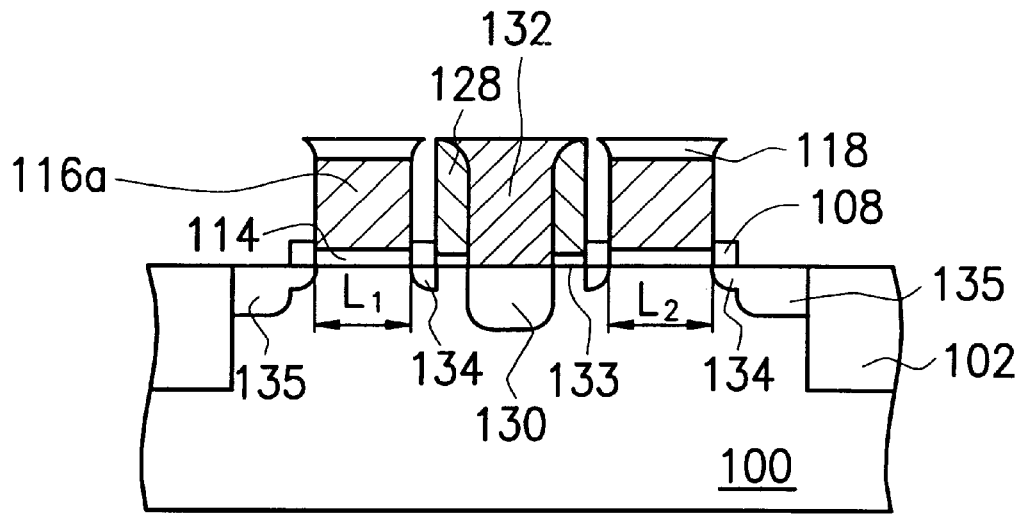

As shown in FIG. 1I, the oxide layer 104 and the spacer 112 are removed in sequence.

With the reduction of the semiconductor device, the channel length of the MOS device is decreased, and the performance of the MOS device can be improved thereby.

As the channel length of the MOS device is shorter than a level, however, the short channel effect occurs and problems are induced thereby. The short channel effect is more obvious as the channel length of the MOS device is shorter. Additionally, hot electron effect occurs due to the short channel length of the MOS device.

One method for solving the short channel effect is to form a doped region adjacent to the original source/drain region. The dosage of the doped region is lighter than that of the original source/drain region, so the doped region is called a lightly doped drain (LDD) region.

An ion implantation process is performed to form a doped region 134 and a doped region 135 in the substrate 100. Ions used in the ion implantation process are preferably n-type ions, and the dosage is about 1E13–1E14 ions/cm$^3$. Since the region for forming the doped region 134 is blocked by the oxide layer 108 during the ion implantation process, the dosage of the doped region 135 is heavier than that of the doped region 134. Therefore, the doped region 134 serves as an LDD region, and the doped region 135 serves as a drain region.

Each channel $L_1$, $L_2$ under the conductive layer 116a is formed self-aligned with the spacer 112 (shown in FIG. 1H) serving as a mask. Therefore, the dimension of the channel is not limited by the resolution of the photolithography process. By this present method, a DRAM device with an ultra-short channel is formed, and the performance of the device is improved.

A part of the substrate 100 between the doped region 134 and the doped region 130 can be used as an inversion layer 133. The inversion layer 133 serves as an ultra-shallow junction to reduce the electric field.

The doped region 134, and the inversion layer 133, as well, is formed between the doped region 130 and the doped region 135; thus, the distance between the doped region 130 and the doped region 135 is elongated. Due to the long distance between the doped region 130 and the doped region 135, the short channel effect is avoided and the electric field is far away from the doped region 130 serving as a source region.

Figure 1J:
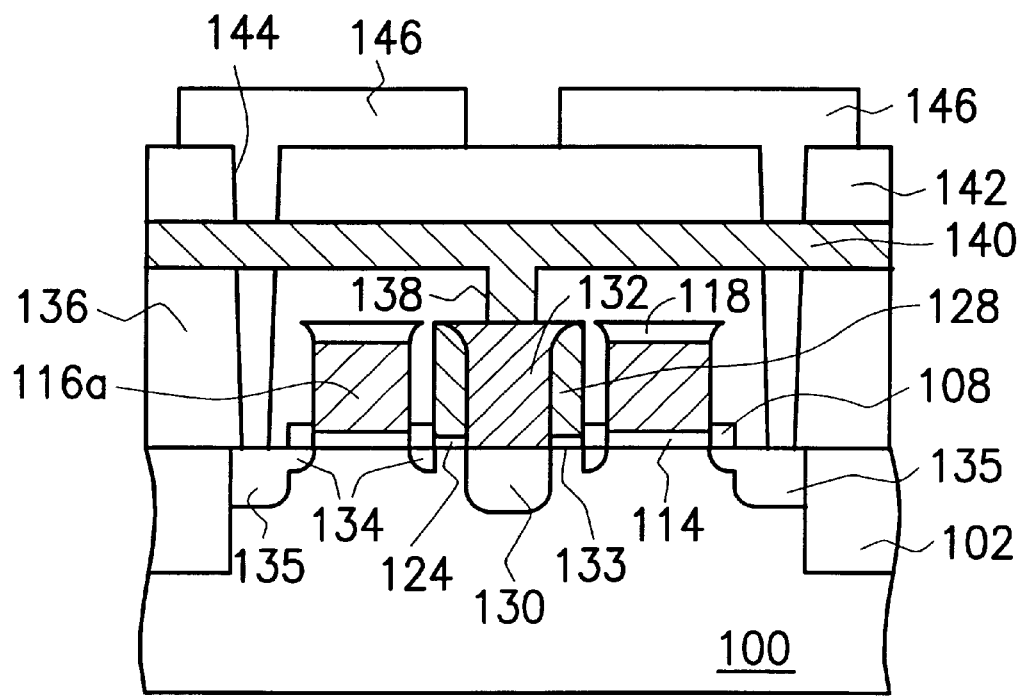

Referring to FIG. 1J, a planarized dielectric layer 136 such as a multi-layer oxide layer or made of silicon dioxide or borophosphosilicate glass (BPSG) is formed over the substrate 100. The method for forming the dielectric layer 136 includes the following steps. A dielectric layer is formed over the substrate 100 by chemical vapor depostion (CVD), and then the dielectric layer is planarized. A contact opening 138 exposing the conductive layer 132 is formed in the dielectric layer 136. A conductive layer (not shown), preferably polysilicon, is formed on the dielectric layer 136 and fills the contact opening 138; the conductive layer is then planarized and defined. A conductive layer 140 coupled with the conductive layer 132 is formed. Furthermore, the conductive layer 140 serves as a bitline.

An inter-polysilicon dielectric layer 142 is formed over the substrate 100 by, for example, CVD. A storage node opening 144 exposing the doped region 135 is formed in the inter-polysilicon dielectric layer 142 and the dielectric layer 136. A conductive layer (not shown), preferably polysilicon, is formed on the inter-polysilicon dielectric layer 142 and fills the storage node opening 144; moreover, the conductive layer couples with the doped region 135 and the thickness of the conductive layer depends on the desired storage node. A storage node 146 is formed by defining the conductive layer.

Since the polysilicon spacer 128, the oxide layer 124, the doped region 134 and the doped region 130 together constitute an extra MOS device, a problem of disturbance between wordlines is avoided; additionally, the device can be operated bit by bit. Stand-by current is reduced, and refresh time is extended.

According to the foregoing, the advantages of the invention include the following:

1. By using the spacer as a mask to define the channel, the channel length of the device is not limited by the resolution of the photolithography process in this method. A DRAM device with an ultra-short channel is formed, and the performance of the device is improved thereby.

2. The inversion layer under the polysilicon spacer serves as an ultra-shallow junction to reduce the electric field in this invention.

3. In this invention, a LDD region is formed between the source region and the drain region, and an inversion layer as well, so that the distance between the source region and the drain region is elongated. The short channel effect is avoided. Furthermore, the electric field is far away the gate oxide layer; thus, reliability of the device is increased.

4. An extra MOS device is formed in this invention, therefore the problem of disturbance is avoided, and the device can be operated bit by bit. Moreover, the standby current is reduced, and the refresh time is extended.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a dynamic random access memory device, comprising the following steps:

providing a substrate with an isolation structure;

forming a first oxide layer with a first opening exposing a first portion of the substrate on the substrate;

forming a pad oxide layer on the first portion of the substrate;

forming a first spacer on a sidewall of the first opening;

removing a portion of the pad oxide layer to expose a second portion of the substrate;

forming a gate oxide layer on the second portion of the substrate;

forming a first conductive layer within the first opening, wherein a surface of the first conductive layer is as high as that of the first oxide layer;

forming a silicide layer on the first conductive layer;

forming a second opening in the first oxide layer to expose a third portion of the substrate;

forming a second oxide layer on the third portion of the substrate;

forming a second spacer on a sidewall of the second opening;

removing a portion of the second oxide layer to form a first contact opening, wherein the first contact opening exposes the substrate;

forming a first doped region under the first contact opening in the substrate;

forming a second conductive layer within the first contact opening, wherein a surface of the second conductive layer is as high as that of the first oxide layer;

removing the first oxide layer and the first spacer;

performing an ion implantation process to form a second doped region and a third region in the substrate;

forming a first dielectric layer with a second contact opening exposing the second conductive layer over the substrate;

forming a bitline within the second contact opening, wherein the bitline couples with the first doped region via the second conductive layer;

forming a second dielectric layer over the substrate;

forming a storage node opening in the second dielectric layer and the first dielectric layer to expose the third doped region; and forming a storage node within the storage node opening, wherein the storage node couples with the third doped region.

2. The method according to claim 1, wherein a material of the first spacer includes silicon nitride.

3. The method according to claim 1, wherein a material of the second spacer includes polysilicon.

4. The method according to claim 1, wherein a material of the bitline includes polysilicon.

5. The method according to claim 1, wherein the first conductive layer is preferably a wordline.

6. The method according to claim 1, wherein a material of the second conductive layer includes polysilicon.

7. The method according to claim 1, wherein a material of the storage node includes polysilicon.

8. The method according to claim 1, wherein the second oxide layer is thinner than the gate oxide layer.

9. A method for forming a device with an ultra-short channel, comprising the following steps:

forming a first oxide layer with a first opening on a substrate, wherein the first opening exposes the substrate;

forming a pad oxide layer in the first opening;

forming a first spacer on a sidewall of the first opening;

removing a portion of the pad oxide layer to expose the substrate;

forming a gate oxide layer in the first opening;

forming a first conductive layer within the first opening;

removing a portion of the first oxide layer to form a second opening exposing the substrate;

forming a second oxide layer in the second opening;

forming a second spacer on a sidewall of the second opening;

removing a portion of the second oxide layer to form a first contact opening exposing the substrate;

forming a source region under the first contact opening;

forming a second conductive layer within the first contact opening;

removing the first oxide layer and the first spacer; and performing an ion implantation process to form a lightly doped drain region and a drain region in the substrate.

10. The method according to claim 9, wherein a material of the first spacer includes silicon nitride.

11. The method according to claim 9, wherein the material of the second spacer includes polysilicon.

12. The method according to claim 9, wherein the first conductive layer is preferably a wordline.

13. The method according to claim 9, wherein a material of the second conductive layer includes polysilicon.

14. The method according to claim 9, wherein the second oxide layer is thinner than the gate oxide layer.

15. The method according to claim 9, wherein a silicide layer is formed on the first conductive layer.

* * * * *